United States Patent [19]

Schwarzbauer

[11] Patent Number: 4,903,886
[45] Date of Patent: Feb. 27, 1990

[54] METHOD AND APPARATUS FOR FASTENING SEMICONDUCTOR COMPONENTS TO SUBSTRATES

[75] Inventor: Herbert Schwarzbauer, Munich, Fed. Rep. of Germany

[73] Assignee: Siemens Aktiengesellschaft, Berlin and Munich, Fed. Rep. of Germany

[21] Appl. No.: 317,596

[22] Filed: Mar. 1, 1989

[30] Foreign Application Priority Data

Mar. 3, 1988 [DE] Fed. Rep. of Germany ....... 3806980

[51] Int. Cl.$^4$ .................... H01L 21/58; B23K 20/02
[52] U.S. Cl. .................... 228/106; 228/193; 228/263.12
[58] Field of Search ............ 228/106, 180.2, 188, 228/193, 194, 243, 263.12

[56] References Cited

U.S. PATENT DOCUMENTS

| | | | |
|---|---|---|---|
| 3,650,454 | 3/1972 | Coucoulas | 228/106 X |
| 3,670,396 | 6/1972 | Lindberg | 228/106 |
| 3,914,850 | 10/1975 | Coucoulas | 228/263.12 |
| 4,444,352 | 4/1984 | Glascock | 228/106 X |
| 4,810,672 | 3/1989 | Schwarzbauer | 437/209 |

FOREIGN PATENT DOCUMENTS 3325355  8/1984  Fed. Rep. of Germany ...... 228/193

Primary Examiner—Kenneth J. Ramsey
Attorney, Agent, or Firm—Hill, Van Santen, Steadman & Simpson

[57] ABSTRACT

A method and apparatus for fastening semiconductor components, such as power semiconductors, onto substrates is a diffusion welding method wherein the surfaces to be joined are provided with precious metal contact layers and are pressed together with at least 500 kp/cm$^2$ at a moderate temperature of approximately 150 to 200 degrees C. Components which have a structured or shaped upper side can be joined to substrates when they are inserted in common with a member of elastically deformable material, such as silicone rubber, into a receptacle chamber that is closed by a movable die which transmits the pressing power. The deformable member completely fills out the remaining interior of the receptacle chamber when the pressing power is reached.

6 Claims, 1 Drawing Sheet

METHOD AND APPARATUS FOR FASTENING SEMICONDUCTOR COMPONENTS TO SUBSTRATES

BACKGROUND OF THE INVENTION

1. Field of the Invention

The present invention is related generally to a method for fastening semiconductor components to substrates by diffusion welding wherein the surfaces to be joined are provided with a metallization and are pressed together while being heated. The invention also relates to an arrangement for implementing the method. The method and apparatus find particular use for large-area power semiconductors.

2. Description of the Related Art

A method is disclosed in German published application 33 25 355 wherein a metallization of a surface or area of a semiconductor component which is to joined to the substrate ensues by chemical deposition of the metal or by vapor deposition of the metal in a vacuum. In the German published application is also disclosed another method of this species wherein a metal film or foil is inserted between the surfaces of the components and the substrate that are to be joined to one another. The parts are then subjected to a diffusion welding process.

The disclosed method has disadvantages, however, in that the diffusion welding occurs in a vacuum chamber and requires a temperature of approximately 550 degrees C. and a pressing power of about 150 kp/cm². Due to the different coefficients of thermal expansion in the individual parts, the high temperature load stresses the semiconductor components which result in corresponding curved or buckled portions in the finished product.

SUMMARY OF THE INVENTION

An object of the present invention is to provide a method and apparatus for fastening semiconductors components to substrates by diffusion welding which involves significantly lower thermal loads on the component hhan is the case in the known methods. This and other objects of the invention are achieved by using a first precious metal contact layer as the metallization film and by providing a second precious metal contact layer on the corresponding surface of the substrate. The semiconductor component and substrate are then heated in an air filled space to temperatures in the range of 150 to 250 degrees C. and subjected to a pressing power in the range of between 500 through 2500 kp/cm².

In an alternate embodiment, a first precious metal contact layer is provided as the metallization film and the surface of the substrate to joined to the semiconductor component is provided with a second precious metal contacting layer. A plastically deformable metal foil composed of a precious metal at least at its two surfaces lying against the precious metal contacting layers is inserted between the two precious metal contacting layers. The semiconductor component, the substrate and the metal film are heated to temperatures lying in a range of from 150 to 250 degrees C. and a pressing power is exerted on these parts in an air filled space with range of approximately 500 to 2500 kp/cm².

An advantage obtainable with the method according to the invention is that little thermal stress occurs at the low temperatures in the range of approximately 150 through 250 degrees C., which is comparable to the temperatures that occurred during the operation of power semiconductors, and particularly power thyristors. It is, thus, possible that the present method can be used with finished semiconductor components without risking damage to them. Furthermore, a vacuum chamber for carrying out the diffusion welding process can be eliminated since the method is carried out in air.

An improvement in the method includes placing the component on the substrate, possibly with the interpositioning of the metal film, and placing the parts into a receptacle means composed of a floor part and a lateral wall part, the receptacle means being augmented, or covered, by a die movable in the direction of the floor part to form a closed receptacle chamber. The floor part of the chamber is supported against a first pressing ram and the die which is movable in the direction of the floor part is supported against a second pressing ram. A deformable member of a temperature-resistant, elastically shapable material is placed into the receptacle means, the deformable member having a volume which is such that, when the pressing power has been reached, it completely fills out the interior of the receptacle chamber which is not occupied by the component and by the substrate.

The deformable member prevents direct contact between the die and the component or the substrate. This improvement is distinguished in that an extremely gentle transmission of pressure onto the semiconductor component occurs as a result of the pressure transmission medium which is provided by the deformable member. The semiconductor component may have a structured, three-dimensional surface which is formed, for example, by MOS structures integrated on the component and, yet the present method enables the component to be diffusion welded without damage or destruction of such structures as the result of the pressing power.

An arrangement for implementing the method of the invention includes a receptacle means provided so that the component which has been put in place on the substrate and the deformable member can be placed into the receptacle means. The receptacle means is composed of the floor part and the lateral wall part and is augmented by the die movable in the direction of the floor part to form a closed receptacle chamber. The receptacle chamber is introduced into a press which exerts a pressing power. The floor part of the receptacle chamber is supported against a first pressing ram, and the die which is movable in the direction of the floor part is supported against a second pressing ram. In an improvement, the die which is movable in the direction of the floor part is surrounded by the lateral wall part of the receptacle means and a sealing ring pressing against the inside of the lateral wall part is provided wherein the sealing ring is supported against the edge of the die.

A further embodiment has the die comprising an advanced edge which embraces the lateral wall part of the receptacle means and further includes a sealing ring pressing against the inside of the advanced edge of the die. The sealing ring is supported against the edge of the lateral wall part of the receptacle means to provide a seal between the receptacle and die.

Another improvement is that the deformable member is formed in two parts wherein the first part is annularly shaped and is placed into the receptacle means so that it surrounds the component and the second part is formed as a plate, or flat member, which is placed into the interior of the receptacle means above the semiconductor component. In an embodiment having a die with an advanced edge, a deformable member is formed in two parts wherein the first part is annularly shaped and is placed into the receptacle means so that it surrounds the component and the second part is formed as a plate, or flat member, which is arranged in the interior space formed by the projecting edge of the die. The deformable member may be formed either of a silicone rubber or of a temperature-resistant elastomer.

In any of the foregoing embodiments, the press ram against which the floor part is supported is heated to produce the welding temperatures. As a further improvement, the die may be composed of part of the second press ram.

DESCRIPTION OF THE PREFERRED EMBODIMENTS

Figure 1:
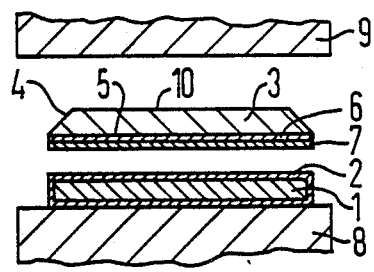
FIG. 1 is a cross section of a semiconductor component and a substrate as well as an arrangement suitable for implementing the method of the present invention.

In FIG. 1 is shown a substrate 1 that is to be joined to a semiconductor component 3 by a diffusion welding process in accordance with the method of the invention. For example, the substrate 1 is a wafer of molybdenum having a thickness of approximately 1.5 mm and a diameter of approximately 29.6 mm. The substrate wafer 1 is first coated with a chemically or voltaically or vapor-deposited precious metal contact layer 2. The contact layer may be of, for example, gold or silver having a thickness of approximately 1 to 2 micrometers. The semiconductor component 3 is a silicon body of a large area component which is to be secured to the substrate 1. One example of a large area semiconductor component for fastening by the present method is a power thyristor. Semiconductor component 3 includes beveled edges 4 which later form the electrode of the anode side after the thyristor has been joined to the substrate 1.

The underside 5 of the silicon body 3 is coated with a metallic intermediate layer 6 of, for example, aluminum, silver, copper or gold (Al, Ag, Cu or Au) having a layer thickness of approximately 10 to 20 micrometers. The intermediate layer 6 is plastically deformable to compensate for surface roughnesses of the surfaces to be joined to one another in the following steps of the method. The roughness of the upper side of the substrate 1 and the underside 5 of the component 3 should not exceed a range of approximately 1 to 1.5 micrometers for the foregoing layer thickness. If the metallic intermediate layer 6 is not composed of a precious metal, a further precious metal contact layer 7 having a thickness of approximately 1 to 2 micrometers is applied thereon, this further layer being preferably composed of gold or silver.

The parts 1 and 3 which have been provided with the layers 2, 6 and 7 in the foregoing way are now placed on top of one another so that the layers 2 and 7 touch. The arrangement 1 and 3 is introduced into a press which is preferably a hydraulic press having press rams 8 and 9. The press rams 8 and 9 are heated so that the arrangement 1 and 2 is brought to a temperature lying approximately in the range of 150 to 250 degrees C. This temperature range is a moderate temperature range which comparable to the operating temperature of a large area power semiconductor. For example, the operating temperature of a diode can amount to about 200 C. The press rams 8 and 9 are moved toward one another by actuating the press so that the parts 1 and 3 are pressed together with a pressing power of about 500 to 2500 kp/cm$^2$ or more over the course of a few minutes. This results in a diffusion welding process which achieves a connection between the semiconductor component 3 and the substrate 1 that has an extremely low electrical and thermal contact resistance and an extremely high degree of uniformity and great adhesive strength.

It is expedient in the above-described diffusion welding process of the present invention to protect an upper side 10 of the semiconductor component 3 against damage due from the press ram 9 using a plastically deformable disk of, for example, aluminum.

In a departure from the foregoing embodiment of the invention, a plastically deformable metallic intermediate layer corresponding to the layer 6 is provided on the substrate 1. The intermediate layer 6 then also expediently has a layer thickness of between 10 and 20 micrometers. A precious metal contact layer 2 of one of the foregoing metals having the described thickness is then applied to intermediate layer in the way set forth above. The metallic intermediate layer 6 on the component 3 can thereby be omitted. If the intermediate layer 6 on the component remains in addition to the metallic intermediate layer provided on the substrate, then, together they compensate for irregularities in the two surfaces of the semiconductor component 3 and the substrate 1 to be joined to one another.

Figure 2:
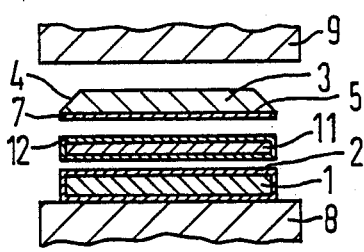
FIG. 2 is a cross section of a semiconductor component and a substrate together with a metal film placed therebetween in an arrangement of FIG. 1.

With reference to FIG. 2, another, preferred development of the invention utilizes a foil, or a thin sheet, 11 of plastically deformable metal of, for example, aluminum, silver, copper or gold having a foil thickness of about 10 to 20 micrometers in place between the surfaces to joined when the semiconductor component 3 and the substrate 1 are placed on top of one another. Hereto, the substrate 1 and the underside 5 of the semiconductor component 3 are coated with a precious metal contact layer 2 and 7 in the way set forth above. The foil 11 assumes the function of the intermediate layer 6 or of the aforementioned intermediate layer that is placed under the precious metal contact layer 2 that covers the substrate 1. On the other hand, the metal foil 11 can also be provided in addition to one or both intermediate layers that are place under the contact layers 2 or 7. When the metal foil 11 is not entirely composed of a precious metal, then at least its two surfaces lying against the layers 2 and 7 must be composed of a precious metal such as, for example, gold or sliver.

FIG. 2 shows a precious metal coating 12 that is provided on the metal foil 11, which is composed of aluminum or copper. After parts 2 and 3 have been placed together with the interpositioned metal foil 11, the diffusion welding process as set forth above is carried out according to the method of the invention.

Figure 3:
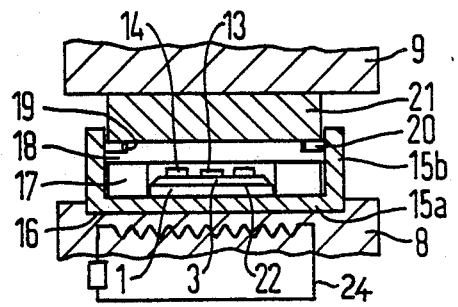
FIG. 3 is a cross section of an arrangement suitable for implementing an improvement in the method of the invention.

According to a further preferred embodiment of the method, the component 3 has a structured or non-planar upper side yet can still be secured to the substrate 1 by diffusion welding without mechanically or physically damaging the component 3 or the upper side thereof. In FIG. 3, a thyristor is shown having the semiconductor body 3 with an upper side provided with an electrode 13 that serves the purpose of igniting and, as warranted, quenching the thyristor, as well as an electrode 14 at the cathode side. An expedient arrangement for implementing the method of the invention has been developed to this extent, as shown in FIG. 3.

After the parts 1 and 3 have been coated with the contacting layers 2 and 7, whereby at least one layer thereof is underlayed by a plastically deformable, metallic intermediate layer 6, for example, and/or whereby a plastically deformable metal foil 11 is provided between the parts 1 and 3, the method proceeds in the following way. An arrangement is formed of the parts 2 and 3 placed on top of one another and is then placed into a metallic, pot-shaped receptacle means (15a and 15b) composed of a floor part 15a and of a lateral wall part 15b. The receptacle means is seated in a recess 16 of the press ram 8. A part 17 shaped as a circular ring and composed of a temperature resistant, elastically deformable material is placed into the receptacle means 15a and 15b so that it surrounds and also preferably centers the arrangement 1 and 2 according to FIG. 3. The deformable material is of, for example, silicon rubber or some other temperature resistant elastomer, such as fluoridated elastomer.

A further, disk-shaped part 18 composed of the same material as the part 17 or of some other elastically deformable material is then inserted into the interior of the receptacle means 15a and 15b so that it closes the receptacle means in an upward direction. The disk-shaped part 18 is supported against the upper side of the annular part 17. A sealing ring 20 of, for example, a metal, a ceramic, or plastic is inserted into an annular recess 19 of the disk-shaped part 18. The sealing ring 20 lies tightly against the inside of the lateral wall part 15b. The receptacle means 15a and 15b is then augmented to form a closed receptacle chamber by placing a metallic die 21 onto the sealing ring 20 or onto the surface of the disk part 18. The die 21 is movable in the direction of the floor part 15a and is supported against the press ram 9.

The press ram 8 is heated by a heating means 24 so that arrangement 1 and 3 is heated to the desired temperature, which lies approximately in the range of 150 to 250 degrees C. The press rams 8 and 9 are moved toward one another by actuating the press so that the die 21 penetrates more deeply into the interior of the receptacle means 15a and 15b. The parts 17 and 18 elastically deform as a result.

Figure 4:
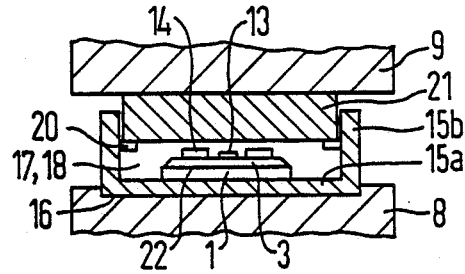
FIG. 4 is a cross section of the arrangement of FIG. 3 for transmitting pressure to the arrangement composed of the substrate and semiconductor components.

In FIG. 4 is shown the position of the press rams 8 and 9 in which a pressure of at least 500 kp/cm² required for the diffusion welding is exerted on the parts 1 and 3 over the course of a few minutes while maintaining the afore-described temperature. The volume of parts the 17 and 18 is dimensioned such that they completely fill out the interior of the receptacle chamber 15a, 15b and 21 which is not occupied by the component 3 and by the substrate 1. The parts 17 and 18 also enable the die 21 to avoid direct contact with the component 3. Despite the structuring and shape of the upper component side established by the different heights of the electrodes 13 and 14, the parts 1 and 3 are successfully pressed together with a constant pressure over the entire area 22 which they abut one another so that a completely uniform connection of the parts ensues.

The elastic deformation of the parts 17 and 18 is to such an extent that the pressure transmitted onto the upper component side is completely uniform without, however, the parts of the elastically deformable material penetrating into the gap that exists between the parts 1 and 3. A faultless joining of the parts 1 and 3 is thus achieved in the immediate edge region of this gap as well. The sealing ring 20 prevents the elastically deformable material of the parts 17 and 18 from emerging between the lateral wall part 15b and the die 21. The behavior of the elastically deformable parts 17 and 18 as described above may be described as "quasi-hydrostatic".

A good joining of the parts 1 and 3 by diffusion welding is, thus, achieved in that a pressure of at least 500 kp/cm² is exerted on the arrangement 1 and 3 at a temperature of, for example, 200 degrees C. over a time duration of approximately ten minutes. However, it should be pointed out that adequate results are already obtained at diffusion times of only a few seconds and that the pressure can be increased to one to two t/cm² or more. The temperatures which lie in a range that comprise a lower limit value of approximately 150 degrees C. and an upper limit value of approximately 250 degrees C. are provided. It should be emphasized that the diffusion welding is undertaken in a normal atmosphere and that it is not necessary to apply a protective atmosphere or a vacuum in the present method.

After the diffusion welding, the arrangement 1 and 3 is removed from the receptacle chamber 15a, 15b and 21 so that the parts 17 and 18 reassume their original shape as shown in FIG. 3. The parts are then available for the diffusion welding of numerous other component-substrate combinations. Instead of the parts 17 and 18 as set forth above, which are formed as circularly or plate-like shapes, a single part of the same material can also be used and is, thus, within the framework of the present invention insofar as the volume corresponds to that the of the two parts 17 and 18.

Figure 5:
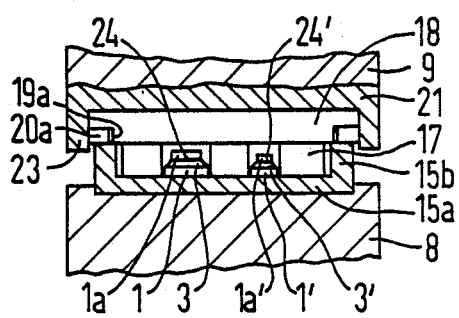
FIG. 5 is cross section of a further arrangement suitable for implementing the method of the invention.

In FIG. 5 is shown a modification of the arrangement according to FIGS. 3 and 4 wherein the die 21 is movable in the direction of the floor part 15a yet has an advanced edge 23 that embraces the lateral wall parts 15b of the receptacle means when moved thereover. Corresponding to FIG. 3, FIG. 5 shows a position of the press rams 8 and 9 wherein pressing power is not yet being exerted so that the deformable members are not yet deformed. Within the receptacle means 15a and 15b is the arrangement 1 and 3 and a second arrangement 1' and 3' on which pressure is exerted for diffusion welding. 1' references a further substrate and 3' references a further semiconductor component to be formed into a second combination. The arrangements 1 and 3 and 1' and 3' do not necessarily differ from those of FIG. 1 although in the illustrated embodiment the components 3 and 3' are each respectively connected to a further substrate 1a or 1a' in the region of their upper limiting surfaces, i.e. on top of the components. The connections of the substrates 1a and 1a' likewise ensue by diffusion welding whereby the surfaces of the substrates and of the semiconductor components that limit gaps 24 and 24' therebetween are again coated with a precious metal contact layers.

The elasticity of the parts 17 and 18 that are shown in their non-deformed condition in FIG. 5 make it possible to also join the components 1 and 3 and 1' and 3' as well as the connections 1a and 3 and 1a' and 3'. The component dimensions, and in particular the components heights, may be different in a single pressing event yet still provide effective welding. It is expedient given the arrangement of FIG. 5 to place the deformable part 18, fashioned as a plate, into the interior of the movable die 21 formed by the projecting edge 23 and hold it in position with the sealing ring 20a that lies in a recess 19a. The deformable part 17 is expediently fashioned as a circular disk that is provided with a recess for each of the arrangements 1 and 3 and 1' and 3'. The arrangement of FIG. 5 is advantageously fashioned so that the die 21 is movable in the direction of the floor part 15a and is composed of part of the press ram 9.

The diffusion welding process that has been set forth proceeds as a solid state reaction without the occurrence of a liquid phase. The method that has been set forth is thereby especially suitable for fastening large area power semiconductors produced in MOS technology or which have been provided with MOS structures on substrates. The low temperatures at which the process is performed do not injure or thermally stress the parts being welded, and the deformable members prevent physical damage to the combined parts. It is, of course, possible to use the present process for different numbers and arrangements of components and substrates.

Although other modifications and changes may be suggested by those skilled in the art, it is the intention of the inventor to embody within the patent warranted hereon all changes and modifications as reasonably and properly come within the scope of his contribution to the art.

I claim:

1. A method for fastening a surface of a semiconductor component to a surface of a substrate by diffusion welding, comprising the steps of:
    providing a surface of a semiconductor component to be joined to a substrate with a metallization, said metallization being a first precious metal contacting layer;
    providing a surface of said substrate to be joined to said component with a second precious metal contacting layer;
    placing said surface of said semiconductor component on said substrate;
    heating said semiconductor component and said substrate to a temperature in a range of approximately 150 to 250 degrees C.; and
    pressing said semiconductor component onto said substrate in an air-filled space with a pressing force in a range of approximately 500 through 2500 $kp/cm^2$ while heating.

2. A method as claimed in claim 1, wherein said semiconductor component is a large area power semiconductor.

3. A method for fastening a semiconductor component to a substrate by diffusion welding, comprising the steps of:
    providing a surface of a semiconductor component to be joined to a substrate with a metallization, said metallization being a first precious metal contacting layer;
    providing a surface of said substrate to be joined to said component with a second precious metal contacting layer;
    inserting a plastically deformable metal foil between said first and second precious metal contacting layers, said metal foil having at least two opposite surfaces composed of a precious metal, said at least two opposite surfaces being against said first and second contacting layers;
    heating said component and said substrate and said metal foil to a temperature approximately in a range of 150 to 250 degrees C.; and
    pressing said component and said substrate and said metal foil together in an air filled space during heating with a pressing power of approximately 500 through 2500 $kp/cm^2$.

4. A method as claimed in claim 3, wherein said component is a large area power semiconductor.

5. A method as claimed in claim 1, further comprising the steps of:
    placing said component and said substrate into a receptacle means composed of a floor part and a lateral wall part;
    placing a deformable member into said receptacle means, said deformable member being of a volume that substantially completely fills an interior of said receptacle chamber that is not occupied by said component and said substrate when pressing power is reached to avoid direct contact between said die and said component; and
    forming a closed receptacle chamber by augmenting said receptacle means with a die movable in a direction of said floor part.

6. A method as claimed in claim 5, wherein said deformable member is a temperature-resistant elastically shapable material.

* * * * *